(12) United States Patent
Hsieh et al.

(10) Patent No.: US 11,069,625 B2
(45) Date of Patent: Jul. 20, 2021

(54) METHOD FOR FORMING PACKAGE STRUCTURE

(71) Applicant: TAIWAN SEMICONDUCTOR MANUFACTURING CO., LTD., Hsinchu (TW)

(72) Inventors: Cheng-Hsien Hsieh, Kaohsiung (TW); Li-Han Hsu, Hsinchu (TW); Wei-Cheng Wu, Hsinchu (TW); Hsien-Wei Chen, Hsinchu (TW); Der-Chyang Yeh, Hsinchu (TW); Chi-Hsi Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 120 days.

(21) Appl. No.: 16/231,735

(22) Filed: Dec. 24, 2018

(65) Prior Publication Data

US 2019/0131249 A1 May 2, 2019

Related U.S. Application Data

(63) Continuation of application No. 15/200,747, filed on Jul. 1, 2016, now Pat. No. 10,163,805.

(51) Int. Cl.
*H01L 23/544* (2006.01)
*H01L 23/31* (2006.01)
(Continued)

(52) U.S. Cl.
CPC .......... *H01L 23/544* (2013.01); *H01L 21/568* (2013.01); *H01L 21/6835* (2013.01); *H01L 23/3114* (2013.01); *H01L 23/528* (2013.01); *H01L 24/14* (2013.01); *H01L 24/19* (2013.01); *H01L 24/82* (2013.01); *H01L 24/96* (2013.01); *H01L 24/97* (2013.01); *H01L 24/32* (2013.01); *H01L 24/73* (2013.01); *H01L 24/92* (2013.01); *H01L 2221/6834* (2013.01); *H01L 2221/68327* (2013.01); *H01L 2221/68359* (2013.01); *H01L 2221/68372* (2013.01);
(Continued)

(58) Field of Classification Search
CPC ... H01L 23/544; H01L 24/82; H01L 23/3114; H01L 23/528; H01L 24/14; H01L 24/96; H01L 2221/68381; H01L 2223/54486; H01L 2221/68359; H01L 2223/54426
See application file for complete search history.

(56) References Cited

U.S. PATENT DOCUMENTS 7,564,115 B2 7/2009 Chen et al.
7,633,165 B2 12/2009 Hsu et al.
(Continued)

*Primary Examiner* — Latanya N Crawford Eason
(74) *Attorney, Agent, or Firm* — Birch, Stewart, Kolasch & Birch, LLP

(57) ABSTRACT

A method for forming a package structure and method for forming the same are provided. The method includes forming a package layer over a substrate, and forming a first dielectric layer over the package layer. The method further includes forming a first alignment mark and a second alignment mark over the first dielectric layer. The method includes forming a second dielectric layer over the first dielectric layer and removing a portion of the second dielectric layer to form a first trench to expose the first alignment mark, and to form a first opening to expose the second alignment.

20 Claims, 15 Drawing Sheets

(51) Int. Cl.
  *H01L 23/528* (2006.01)
  *H01L 23/00* (2006.01)
  *H01L 21/56* (2006.01)
  *H01L 21/683* (2006.01)
(52) U.S. Cl.
  CPC ........... *H01L 2221/68381* (2013.01); *H01L 2223/5442* (2013.01); *H01L 2223/54426* (2013.01); *H01L 2223/54486* (2013.01); *H01L 2224/0239* (2013.01); *H01L 2224/0401* (2013.01); *H01L 2224/04105* (2013.01); *H01L 2224/12105* (2013.01); *H01L 2224/18* (2013.01); *H01L 2224/24137* (2013.01); *H01L 2224/32225* (2013.01); *H01L 2224/73267* (2013.01); *H01L 2224/92244* (2013.01); *H01L 2224/97* (2013.01); *H01L 2924/01013* (2013.01); *H01L 2924/01022* (2013.01); *H01L 2924/01028* (2013.01); *H01L 2924/01029* (2013.01); *H01L 2924/01073* (2013.01); *H01L 2924/01074* (2013.01); *H01L 2924/3512* (2013.01)

(56) References Cited

U.S. PATENT DOCUMENTS

| | | | |
|---|---|---|---|
| 7,772,091 B2 * | 8/2010 | Machida | H01L 24/12 438/462 |
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,426,961 B2 | 4/2013 | Shih et al. | |
| 8,669,174 B2 | 3/2014 | Wu et al. | |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,847,078 B2 * | 9/2014 | Matsuno | H05K 1/0269 174/250 |
| 9,202,788 B2 * | 12/2015 | Okuno | G03F 9/708 |
| 2005/0253275 A1 * | 11/2005 | Hsu | H01L 24/81 257/778 |
| 2010/0208437 A1 * | 8/2010 | Maeda | H01L 24/81 361/760 |
| 2012/0073862 A1 * | 3/2012 | Muramatsu | H05K 1/0269 174/251 |
| 2014/0001645 A1 | 1/2014 | Lin et al. | |
| 2014/0083747 A1 * | 3/2014 | Matsuno | H05K 1/0269 174/251 |
| 2014/0225258 A1 | 8/2014 | Chiu et al. | |
| 2014/0252572 A1 | 9/2014 | Hou et al. | |
| 2015/0287697 A1 | 10/2015 | Tsai et al. | |
| 2015/0348872 A1 | 12/2015 | Kuo et al. | |
| 2015/0348904 A1 | 12/2015 | Huang et al. | |
| 2017/0278802 A1 * | 9/2017 | Chen | H01L 22/30 |

* cited by examiner

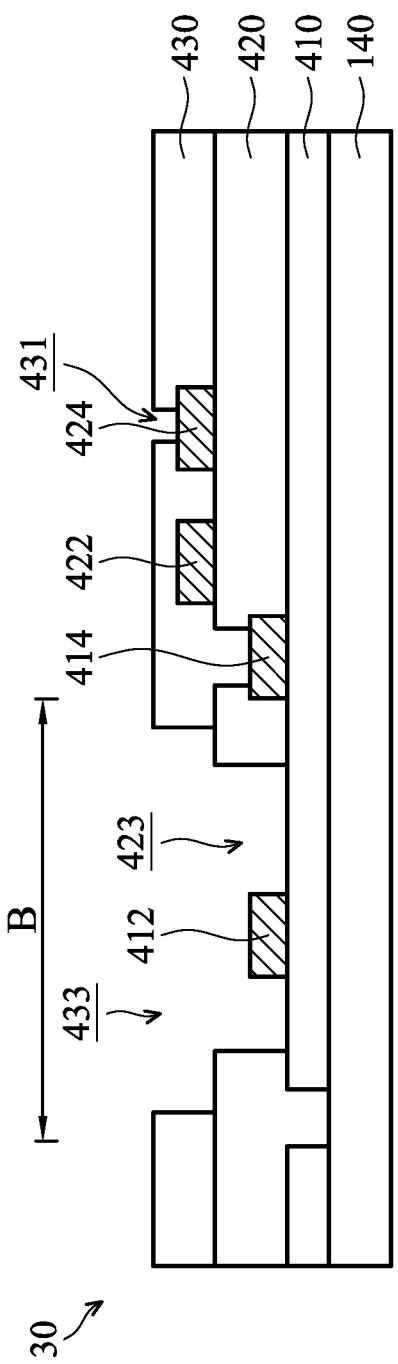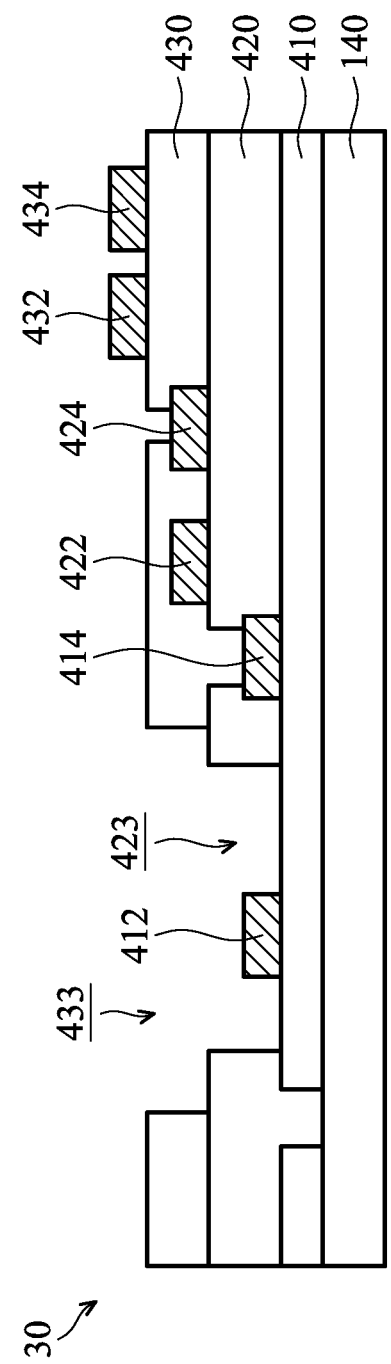

METHOD FOR FORMING PACKAGE STRUCTURE

CROSS REFERENCE TO RELATED APPLICATIONS

This application is a Continuation application of U.S. patent application Ser. No. 15/200,747, filed on Jul. 1, 2016, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting these new packaging technologies, various packages with different or similar functions are integrated together.

Although existing package structures and methods of fabricating package structure have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
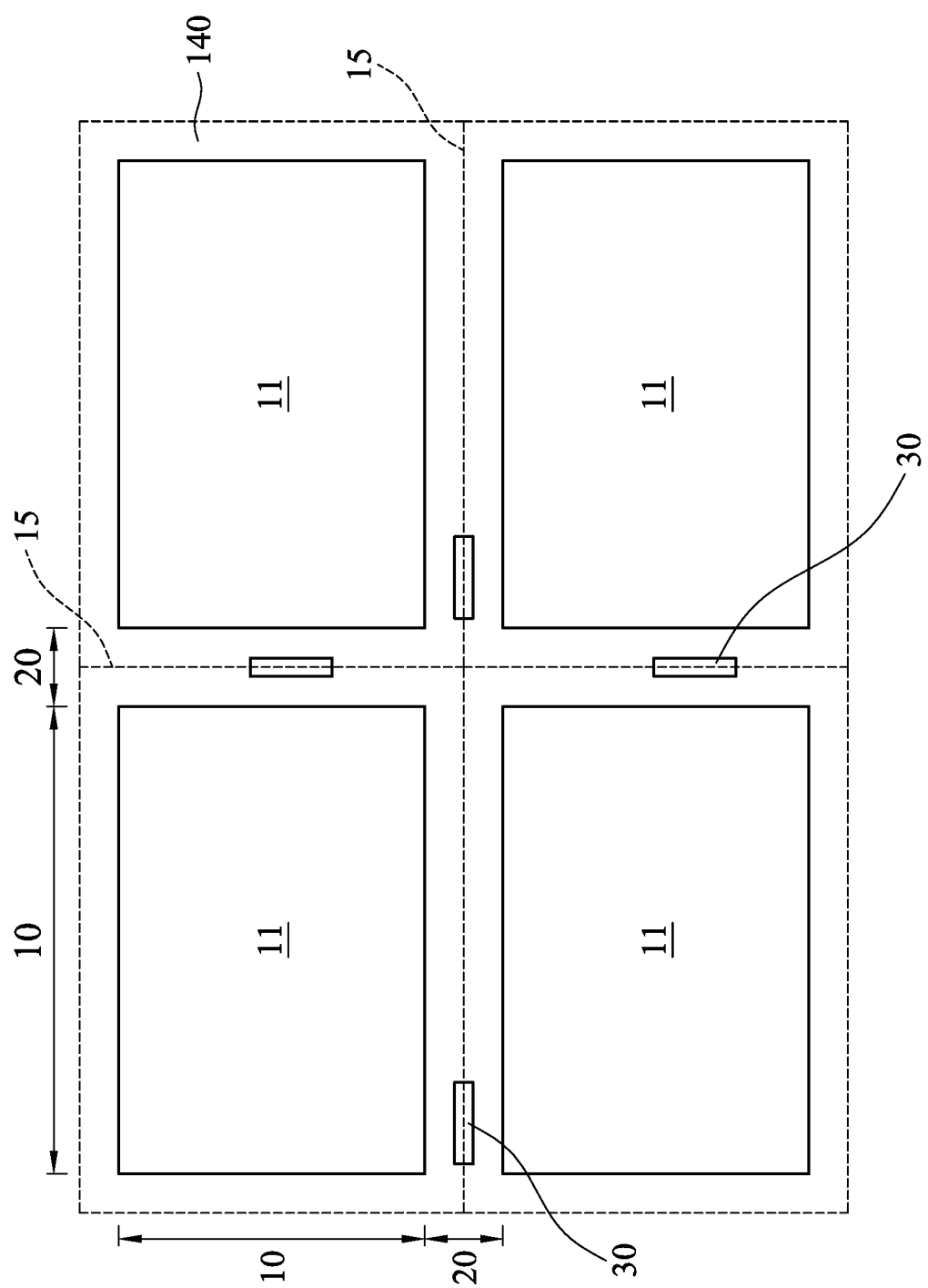
FIG. 1 shows a top-view representation of a package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a package structure and method for forming the same are provided. FIG. 1 shows a top-view representation of a package structure, in accordance with some embodiments of the disclosure.

Figure 3A:
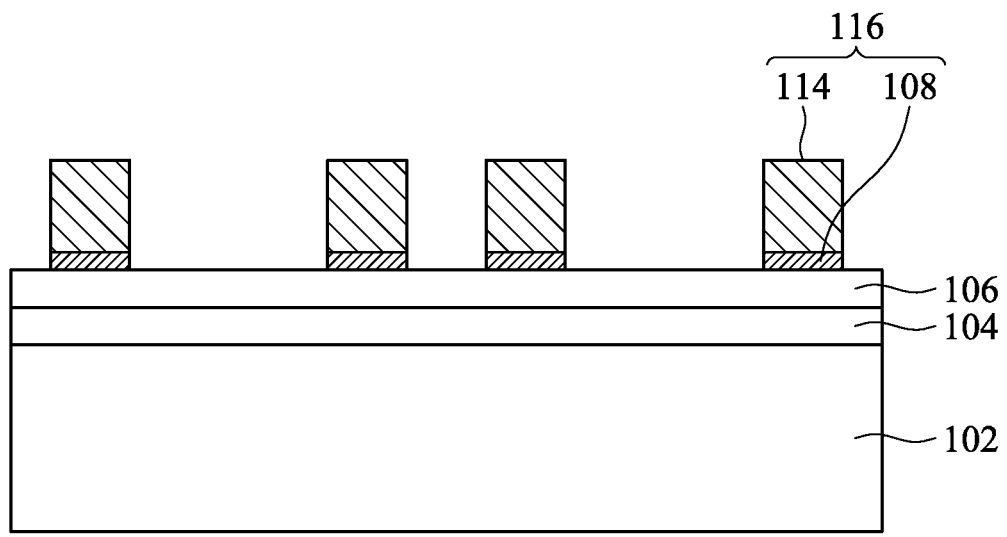
FIGS. 3A-3F show cross-sectional representations of various stages of forming a package structure, in accordance with some embodiments of the disclosure.
Figure 3B:
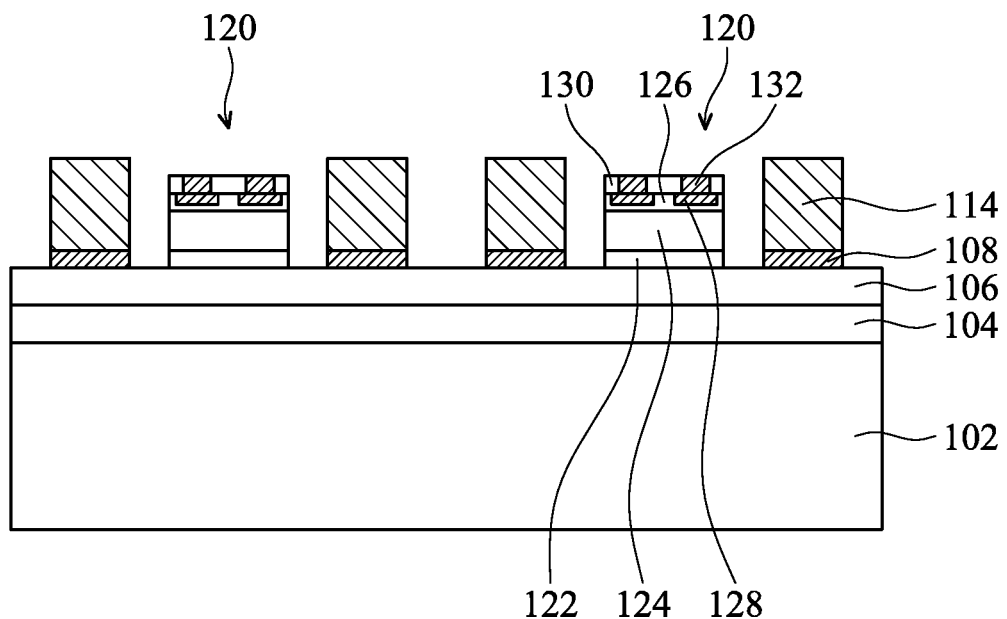
Figure 3C:
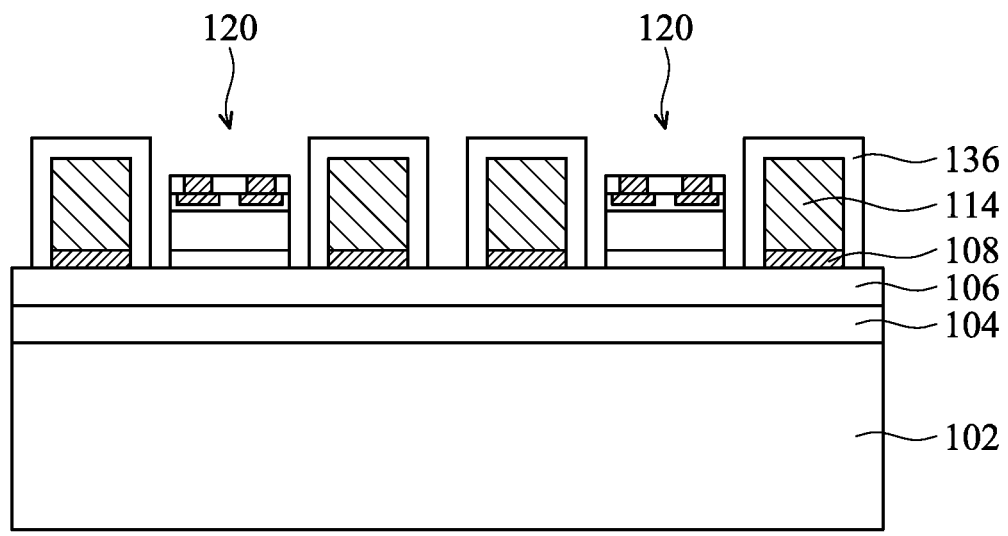
Figure 3D:
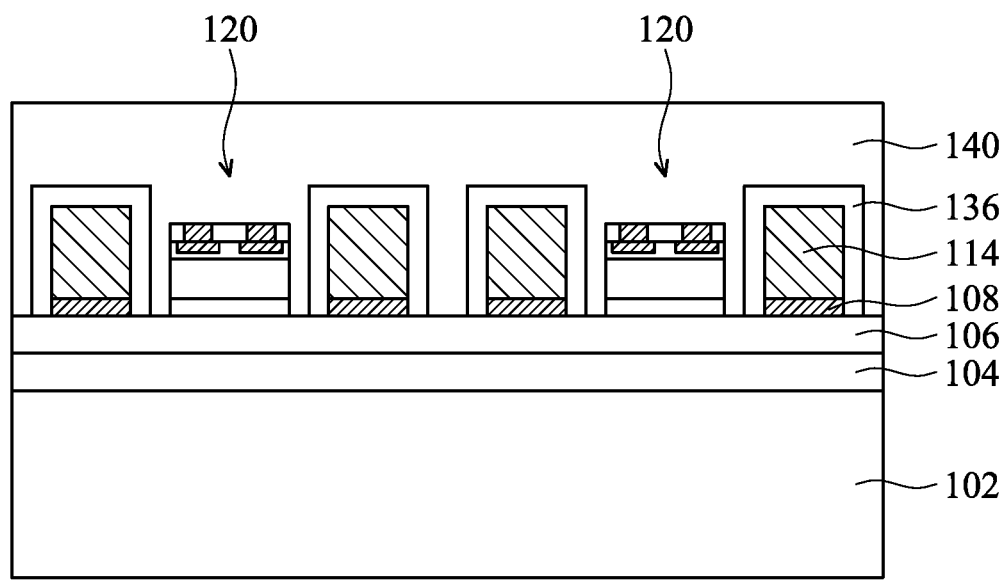

The package structure includes a package layer 140 over a substrate 102 (shown in FIG. 3D). The substrate 102 is a portion of the wafer. The substrate 102 includes a number of die regions 10 and a number of peripheral regions 20. A number of semiconductor dies 11 are formed in the die regions 10. A number of scribe lines 15 are formed between two adjacent semiconductor dies 11. An alignment structure 30 is formed in the peripheral regions 20 over the scribe lines 15. An alignment structure 30 provides an alignment function when different layers are deposited or patterned during the fabrication process.

Figure 2:
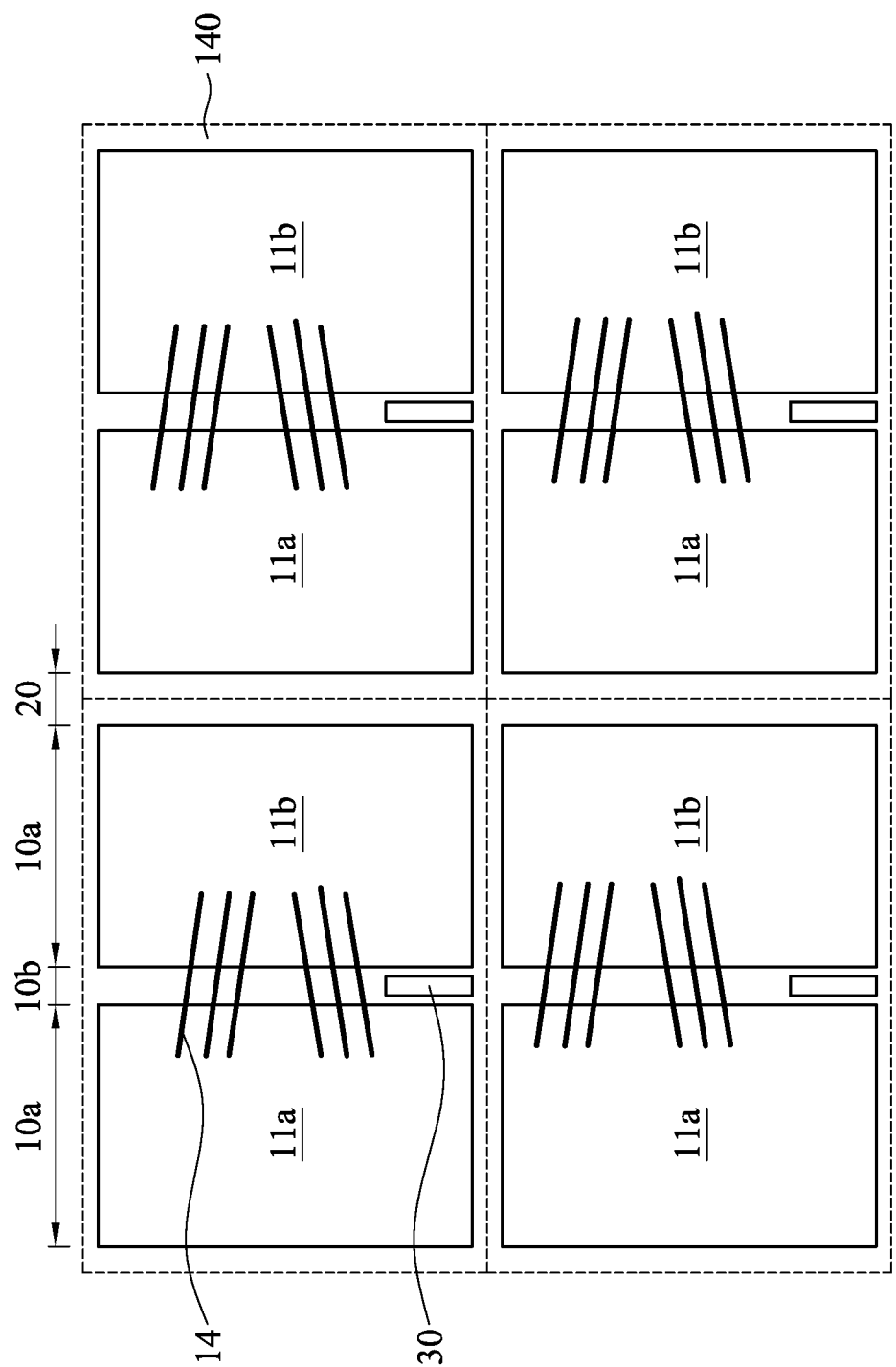
FIG. 2 shows a top-view representation of a package structure, in accordance with some embodiments of the disclosure.

FIG. 2 shows a top-view representation of a package structure, in accordance with some embodiments of the disclosure.

The substrate 102 includes a number of sub-die regions 10a, a gap region 10b and a number of peripheral regions 20. A number of sub-dies 11a and 11b are formed in the sub-die regions 10a. Two adjacent sub-dies 11a, 11b are electrically connected to each other by metal lines 14. The gap region 10b is between the two adjacent sub-die regions 10a. Unlike FIG. 1, the alignment structure 30 is formed over the gap region 10b. Therefore, the peripheral regions 20 in FIG. 2 may be reduced further to increase the area of the sub-die regions 10a for occupying the sub-dies 11a, 11b.

FIGS. 3A-3F show cross-sectional representations of various stages of forming a package structure, in accordance with some embodiments of the disclosure. The package structure is applied to a wafer level package (WLP).

As shown in FIG. 3A, a substrate 102 is provided. The substrate 102 is a temporary support substrate. In some embodiments, the substrate 102 is made of semiconductor material, ceramic material, polymer material, metal material, another applicable material, or a combination thereof. In some embodiments, the substrate 102 is a glass substrate. In some embodiments, the substrate 102 is a semiconductor substrate, such as silicon wafer.

An adhesive layer 104 is formed on the substrate 102. In some embodiments, the adhesive layer is made of glue or foil. In some other embodiments, the adhesive layer 104 is made of a photosensitive material which is easily detached from the substrate 102 by light irradiation. In some embodiments, the adhesive layer 104 is made of a heat-sensitive material.

Afterwards, a base layer 106 is formed on the adhesive layer 104. In some embodiments, the base layer 106 is made of polymer or a polymer-containing layer. The base layer 106 may be a poly-p-phenylenebenzobisthiazole (PBO) layer, a polyimide (PI) layer, a solder resist (SR) layer, an Ajinomoto buildup film (ABF), a die attach film (DAF), another applicable material, or a combination thereof. In some embodiments, the adhesive layer 104 and the base layer 106 are deposited or laminated over the substrate 102.

Afterwards, a seed layer 108 is formed over the base layer 106. In some embodiments, the seed layer 108 is made of metal material, such as copper (Cu), titanium (Ti), copper alloy, titanium alloy, or a combination thereof. In some embodiments, the seed layer 108 is formed by a deposition process, such as chemical vapor deposition process (CVD), physical vapor deposition process (PVD), another applicable process, or a combination thereof.

A conductive structure 114 is formed over the seed layer 108. The conductive structure 114 may be made of metal material, such as copper (Cu), aluminum (Al), tungsten (W), nickel (Ni), alloy thereof, or a combination thereof.

As a result, the conductive structure 114 and the seed layer 108 are in combination referred to as through InFO vias (TIV) 116, which are also referred to as through-vias 116. In some embodiments, the conductive structure 114 and the seed layer 108 are made of the same material, and therefore there is no distinguishable interface therebetween.

Afterwards, a semiconductor die 120 is formed over the base layer 106 through an adhesive layer 122, as shown in FIG. 3B, in accordance with some embodiments of the disclosure. The height of the conductive structure 114 is higher than the height of the semiconductor die 120. The top surface of the conductive structure 114 is higher than the top surface of the semiconductor die 120.

In some embodiments, the adhesive layer 122 is die attach film (DAF). The semiconductor die 120 includes a semiconductor substrate 124, an insulating layer 126, a conductive pad 128, a passivation layer 130 and a connector 132. The conductive pad 128 is formed in the insulating layer 126, and the connector 132 is formed in the passivation layer 130. The connector 132 is electrically connected to the conductive pad 128.

Other device elements may be formed in the semiconductor die 120. The device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes.

An insulating layer 136 is spontaneously formed on the conductive structure 114, as shown in FIG. 3C, in accordance with some embodiments of the disclosure. The insulating layer 136 surrounds the conductive structure 114. In other words, the conductive structure 114 and the seed layer 108 are surrounded by the insulating layer 136.

The conductive structure 114 includes a metal material, and the insulating layer 136 includes a metal element that is the same as that of the metal material. In some embodiments, the insulating layer 136 is a native oxide layer. In some embodiments, the conductive structure 114 includes copper (Cu), and the insulating layer 136 includes cupric oxide and cuprous oxide (CuO and $Cu_2O$).

Afterwards, a package layer 140 is formed over the semiconductor die 120 and the insulating layer 136, as shown in FIG. 3D, in accordance with some embodiments of the disclosure.

The package layer 140 is made of molding compound, such as liquid epoxy, deformable gel, a resin, polyimide, polybenzoxazole (PBO), benzocyclobutene (BCB), a silicone, an acrylate or the like.

Figure 3E:
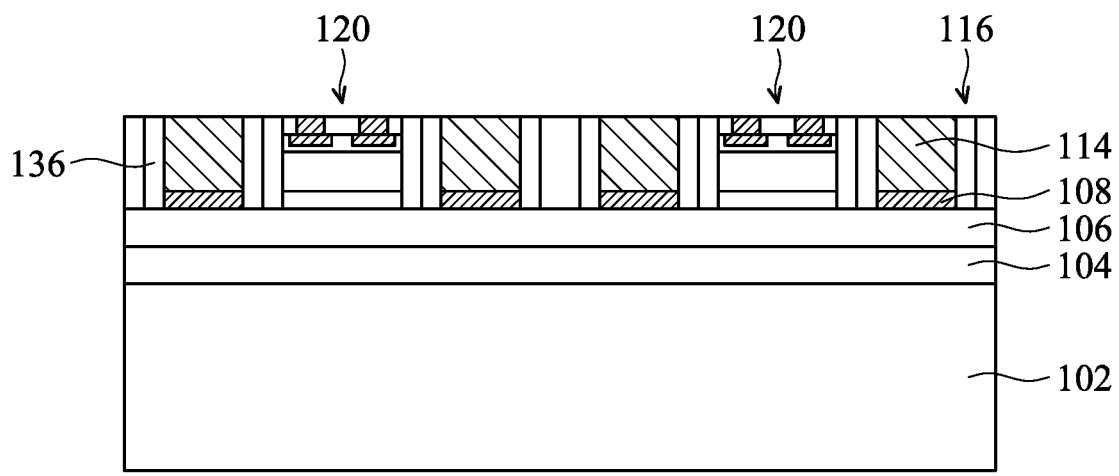

Afterwards, a planarizing process is performed to expose the semiconductor die 120 and the through InFO vias (TIV) 116, as shown in FIG. 3E, in accordance with some embodiments of the disclosure. After the planarizing process, the top surface of the semiconductor die 120 is substantially level with that of the conductive structure 114. In some embodiments, the planarizing process includes grinding process, a chemical mechanical polishing (CMP) process, an etching process, another applicable process, or a combination thereof.

Figure 3F:
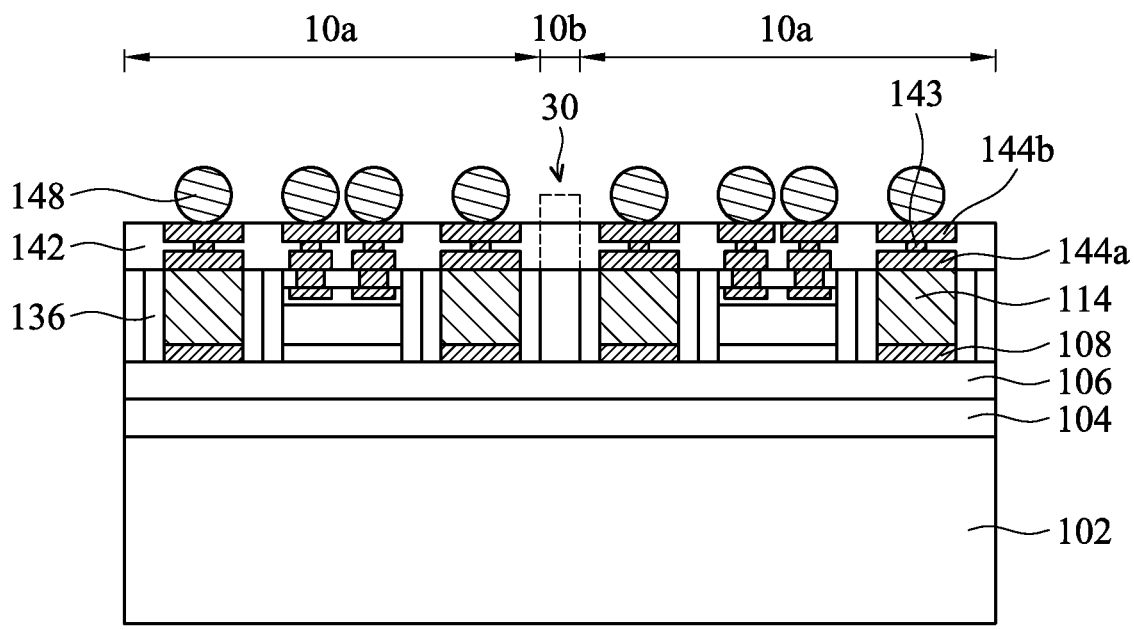

After the planarizing process, a interconnect structure 146 is formed over the package layer 140, as shown in FIG. 3F, in accordance with some embodiments of the disclosure. The interconnect structure 146 includes a first redistribution lines (RDL) 144a, a via 143 and a second RDL 144b formed in the passivation layer 142. The via 143 is between the first RDL 144a and the second RDL 144b. The first RDL 144a is electrically connected to the semiconductor die 120 and the through InFO vias (TIV) 116.

In some embodiments, the first RDL 144a and second RDL 144b are made of metal materials, such as copper (Cu), copper alloy, aluminum (Al), aluminum alloy, tungsten (W), tungsten alloy, titanium (Ti), titanium alloy, tantalum (Ta), or tantalum alloy. In some embodiments, the first RDL 144a and the second RDL 114b are formed by plating, electroless plating, sputtering or chemical vapor deposition (CVD). In some embodiments, the passivation layer 142 is made of polybenzoxazole (PBO), benzocyclobutene (BCB), silicone, acrylates, siloxane, or a combination thereof. In some other embodiments, the passivation layer 142 is made of non-organic materials, such as silicon oxide, un-doped silicate glass, silicon oxynitride, solder resist (SR), silicon nitride, or HMDS (hexamethyldisilazane).

Afterwards, an electrical connector 148 is formed over the interconnect structure 146. In some embodiments, the electrical connector 148 includes the solder ball, metal pillar, another applicable connector. In some embodiments, an under bump metallurgy (UBM) layer (not shown) is formed below the electrical connector 148.

It should be noted that the semiconductor dies 120 are formed in the sub-die regions 10a, and the alignment structure 30 is formed in the gap 10b. The fabricating processes for forming the alignment structure 30 are described in detail later.

FIGS. 4A-4I show cross-sectional representations of various stages of forming the alignment structure 30, in accordance with some embodiments of the disclosure.

Figure 4A:
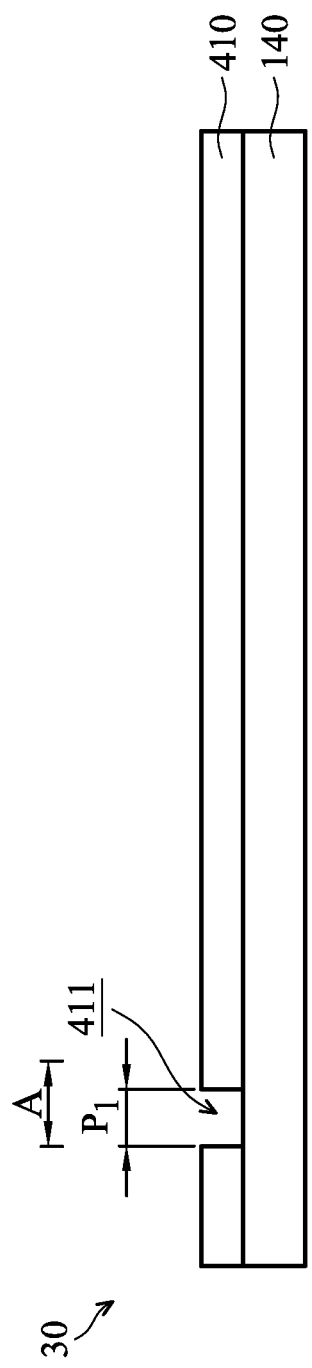
FIGS. 4A-4I show cross-sectional representations of various stages of forming the alignment structure, in accordance with some embodiments of the disclosure.

As shown in FIG. 4A, a first dielectric layer 410 is formed over the package layer 140. In some embodiments, the first dielectric layer 410 is made of polybenzoxazole (PBO), benzocyclobutene (BCB), silicone, acrylates, siloxane, or a combination thereof. In some other embodiments, the first dielectric layer 410 is made of non-organic materials, such as silicon oxide, un-doped silicate glass, silicon oxynitride, solder resist (SR), silicon nitride, HMDS (hexamethyldisilazane). The material of the first dielectric layer 410 may be the same as the material of the passivation layer 142, and the first dielectric layer 410 and the passivation layer 142 may be formed in the same operation.

The first dielectric layer 410 includes a first opening 411. The top surface of the package layer 140 is exposed by the first opening 411. In some other embodiments, more than one first opening 411 is formed in the first dielectric layer 410. The first openings 411 are configured to provide an alignment function.

FIGS. 5A-5D shows top-view representation of the first openings 411, in accordance with some embodiments of the disclosure. FIG. 4A is a cross-sectional representation along I-I' line of FIG. 5A. Each of the first openings 411 has a circle-shaped top-view profile. More specifically, the first openings 411 have rounded edges.

The rounded edges are used to reduce stress, and thus the problem of cracking may be avoided.

Figure 5A:
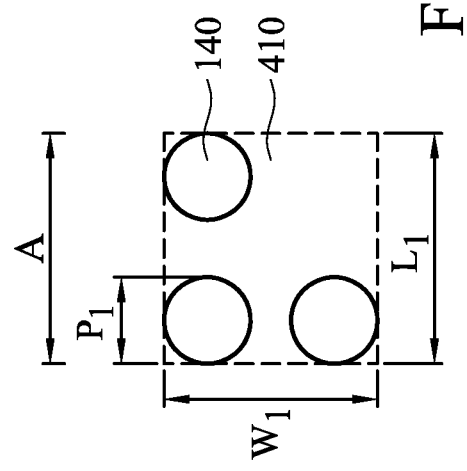
FIGS. 5A-5D shows top-view representation of the first openings, in accordance with some embodiments of the disclosure.

As shown in FIG. 5A, the number of first openings 411 is greater than three, and these first openings 411 are arranged along a first direction (e.g. the X-axis) and a second direction (e.g. the Y-axis). The first direction is orthogonal to the second direction. If the first openings 411 are arranged along in single direction, the alignment function is not good enough. There are three first openings 411 in the first region A. In some other embodiments, four, five or six first openings 411 are formed in the first region A.

In the first region A, an area is defined by a first width $W_1$ and a first length $L_1$. The first region A may have rectangular shape or square shape. Each of the first openings 411 has a first pitch $P_1$. In other words, the ellipse-shaped or circle-shaped structure has a diameter $P_1$. In some embodiments, the first width $W_1$ is in a range from about 40 μm to about 70 μm. In some embodiments, the first length $L_1$ in a range from about 40 μm to about 70 μm. In some embodiments, the first pitch $P_1$ is in a range from about 15 μm to about 25 μm.

If the first openings 411 have sharp corners or edges, some stress may occur on the sharp corners or edges. As a result, some cracks may form due to the stress concentrated on the sharp corners or edges. In order to prevent cracking, the first openings 411 are formed to have rounded corners and edges.

Figure 5B:
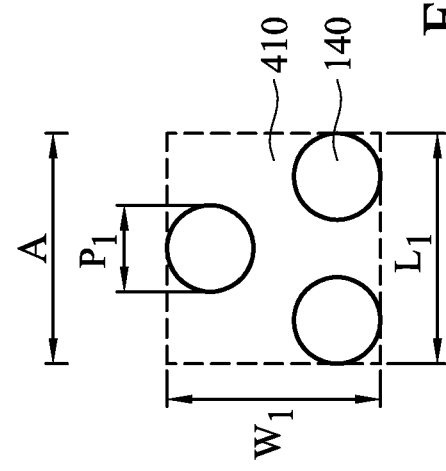

As shown in FIG. 5B, there are three first openings 411 in the first region A, but the arrangement of the first openings 411 in FIG. 5B is different than that in FIG. 5A.

Figure 5C:
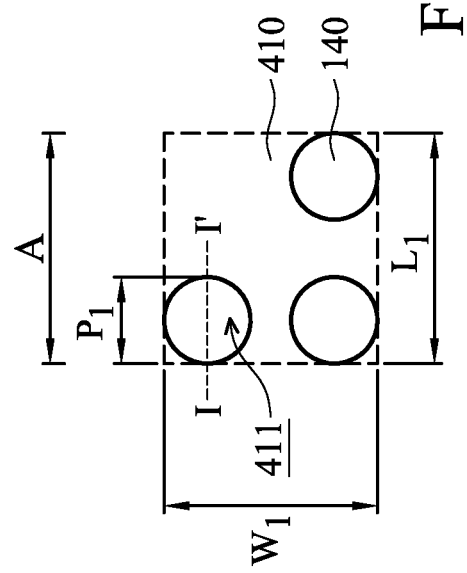

As shown in FIG. 5C, there are four first openings 411 in the first region A. In some embodiments, each of the first openings 411 is the same size. In some other embodiments, each of the first openings 411 is a different size.

Figure 5D:
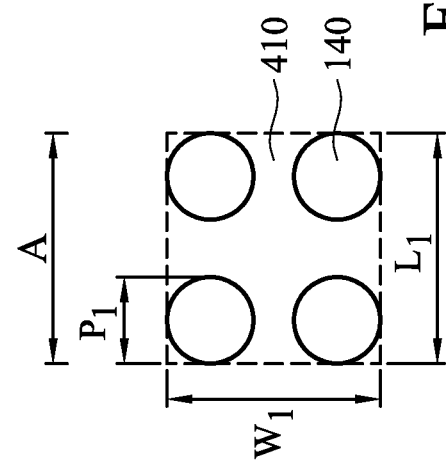
Figure 6A:
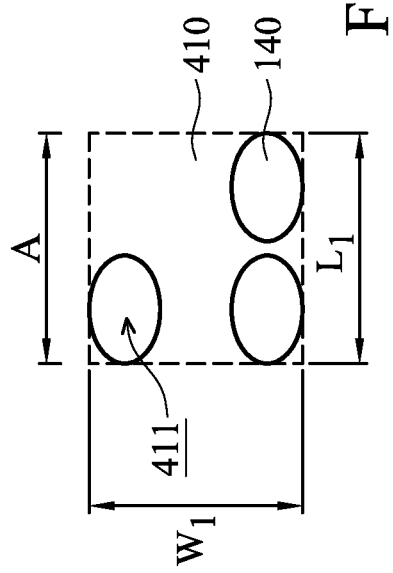
FIGS. 6A-6D show top-view representations of the first openings, in accordance with some embodiments of the disclosure.
Figure 6B:
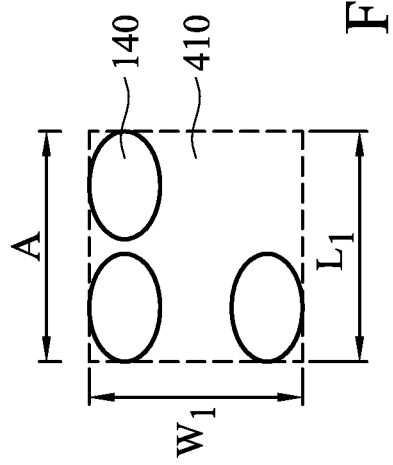
Figure 6C:
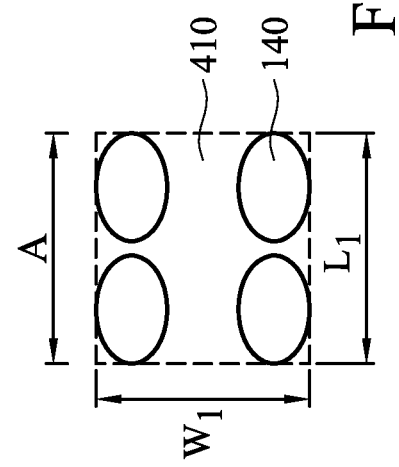
Figure 6D:
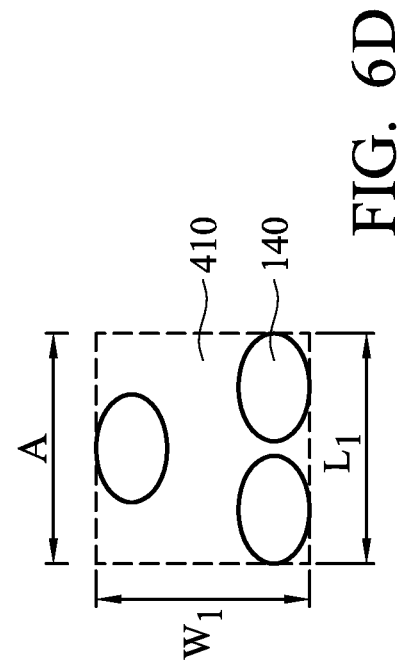

As shown in FIG. 5D, there are three first openings 411 in the first region A.

FIGS. 6A-6D show top-view representations of the first openings 411, in accordance with some embodiments of the disclosure. FIGS. 6A-6D are similar to FIGS. 5A-5D, the difference is that each of the first openings 411 has an ellipse-shaped top-view profile in FIGS. 6A-6D.

Figure 4B:
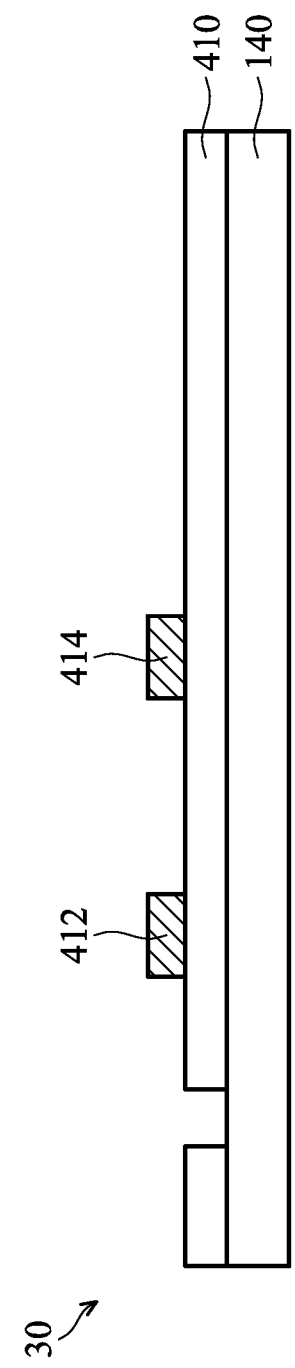

Afterwards, a first alignment mark 412 and a second alignment mark 414 are formed over the first dielectric layer 410, as shown in FIG. 4B, in accordance with some embodiments of the disclosure.

The first alignment mark 412 and the second alignment mark 414 are made of the conductive material, such as metal. In some embodiments, the metal includes copper (Cu), copper alloy, aluminum (Al), aluminum alloy, tungsten (W), tungsten alloy, titanium (Ti), titanium alloy, tantalum (Ta), or tantalum alloy. In some embodiments, the first alignment mark 412, the second alignment mark 414 and the via 143 (shown in FIG. 3F) are formed simultaneously. In other words, the first alignment mark 412, the second alignment mark 414 and the via 143 are in the same level.

Figure 4C:
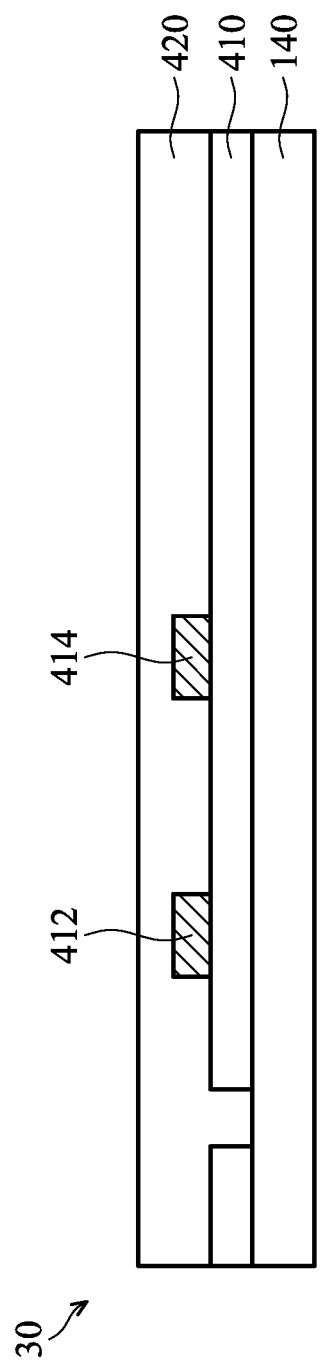

Afterwards, a second dielectric layer 420 is formed over the first dielectric layer 410, as shown in FIG. 4C, in accordance with some embodiments of the disclosure. In addition, the second dielectric layer 420 is formed over the first alignment mark 412 and the second alignment mark 414.

In some embodiments, the second dielectric layer 420 and the first dielectric layer 410 are made of the same material.

Figure 4D:
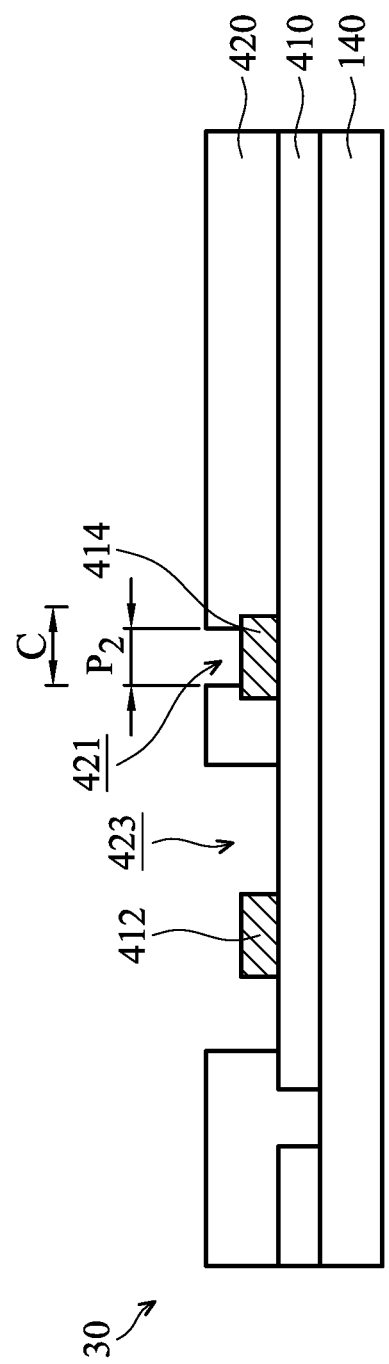

Afterwards, a portion of the second dielectric layer 420 is removed, as shown in FIG. 4D, in accordance with some embodiments of the disclosure. As a result, the second dielectric layer 420 includes a first trench 423 and a second opening 421.

The first alignment mark 412 is exposed by the first trench 423. A portion of the top surface of the second alignment mark 414 is exposed by the second opening 421.

FIGS. 7A-7D show top-view representations of the second opening 421 in the third region C, in accordance with some embodiments of the disclosure. FIG. 4D is a cross-sectional representation along II-IF line of FIG. 7A.

Figure 7A:
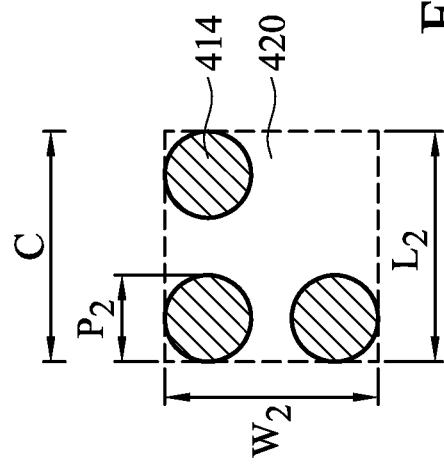
FIGS. 7A-7D show top-view representations of the second opening in the third region C, in accordance with some embodiments of the disclosure.

As shown in FIG. 7A, in the third region C, an area is defined by a second width $W_2$ and a second length $L_2$. The first region A may have rectangular shape or square shape. Each of the first openings 411 has a second pitch $P_2$. In other words, the ellipse-shaped or circle-shaped structure has a diameter $P_2$. In some embodiments, the second width $W_2$ is in a range from about 40 μm to about 70 μm. In some embodiments, the second length $L_2$ in a range from about 40 μm to about 70 μm. In some embodiments, the second pitch $P_2$ is in a range from about 15 μm to about 25 μm.

There are three second openings 421 formed in the third region C. Each of the second openings 421 has rounded corners or edges to prevent cracking. The second alignment mark 414 is exposed by the second openings 421.

Figure 7B:
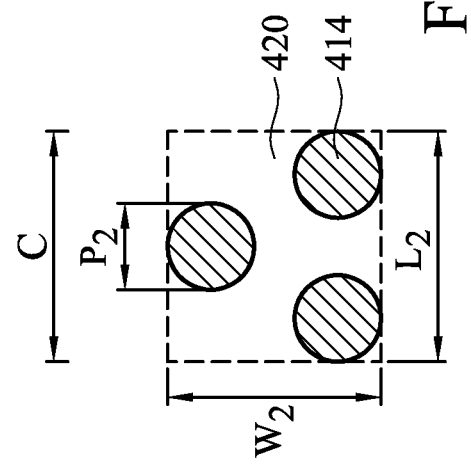

As shown in FIG. 7B, there are three second openings 421 formed in the third region C. However, the arrangement of the second openings 421 in FIG. 7B is different from the arrangement of the second openings 421 in FIG. 7A.

Figure 7C:
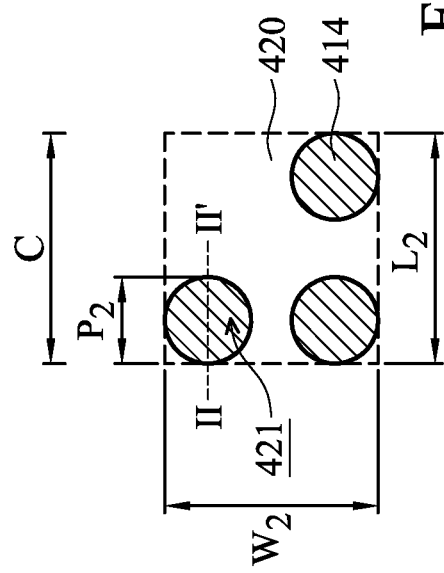

As shown in FIG. 7C, there are four second openings 421 formed in the third region C. In some embodiments, the size of each of the four second openings 421 is the same. In some other embodiments, the size of each of the four second openings 421 is different.

Figure 7D:
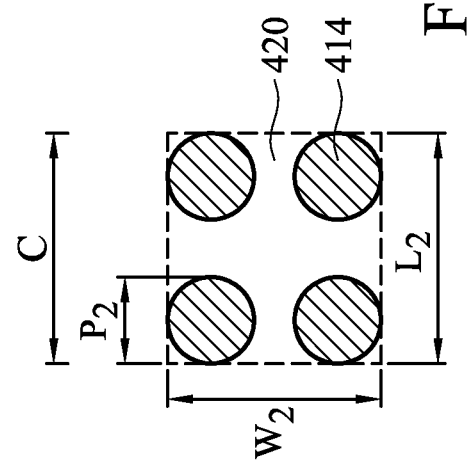

As shown in FIG. 7D, there are three second openings 421 formed in the third region C. Two of the three second openings 421 are at the two corners of the third region C, and one is at the middle along the second length $L_2$.

Figure 4E:
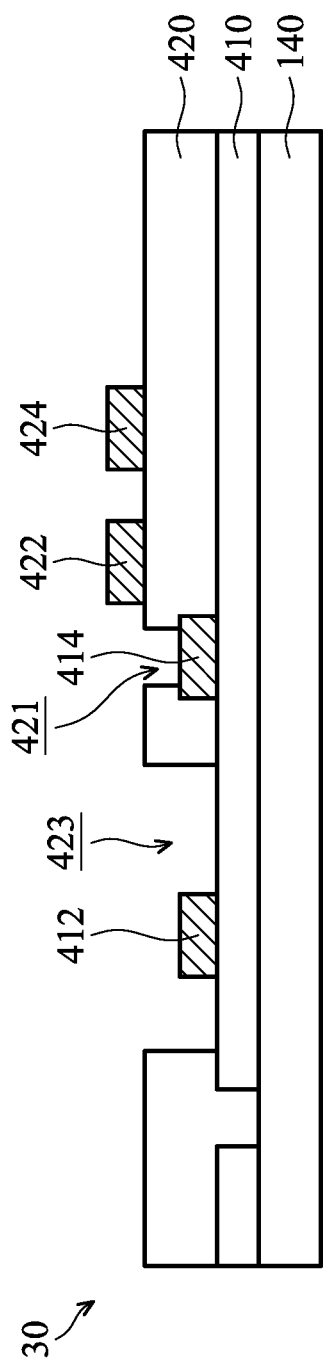

Afterwards, a third alignment mark 422 and a fourth alignment mark 424 are formed over the second dielectric layer 420, as shown in FIG. 4E, in accordance with some embodiments of the disclosure.

The third alignment mark 422 and the fourth alignment mark 424 are made of the conductive material, such as metal. The metal includes copper (Cu), copper alloy, aluminum (Al), aluminum alloy, tungsten (W), tungsten alloy, titanium (Ti), titanium alloy, tantalum (Ta), or tantalum alloy. In some embodiments, the three alignment mark 422, the fourth alignment mark 424 and a second RDL 144b (shown in FIG. 3F) in the sub-die regions 10a are formed simultaneously.

It should be noted that the second alignment mark 414 is made of conductive materials, such as metal material, and the second alignment mark 414 is between the first dielectric layer 410 and the second dielectric layer 420. If no the second alignment mark 414 is between the first dielectric layer 410 and the second dielectric layer 420, some cracks may generated along the second opening 421 due to the stress concentration. Since the metal material of second alignment mark 414 is different from the dielectric materials, the stress will not concentrate on single material. Therefore, the stress is reduced and the problems of cracking are avoided.

Figure 4F:
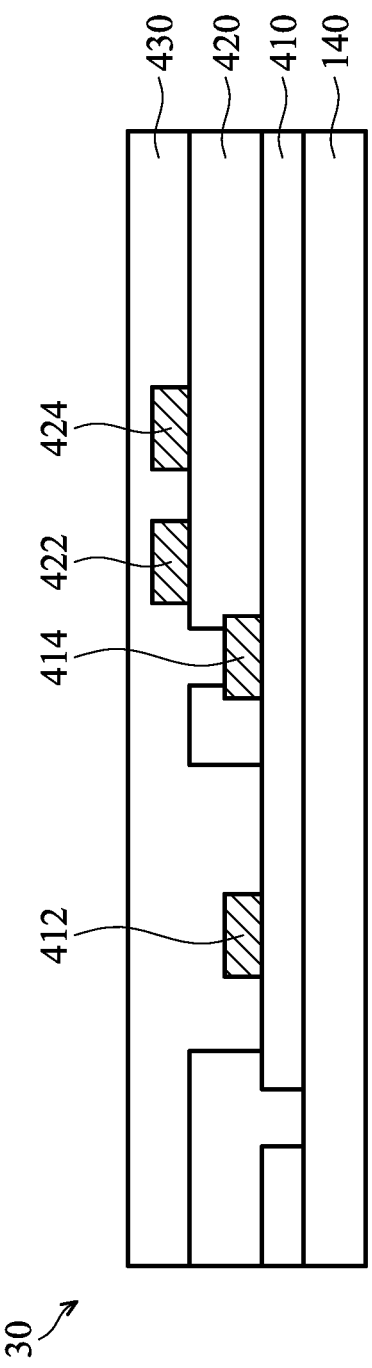
Figure 4:
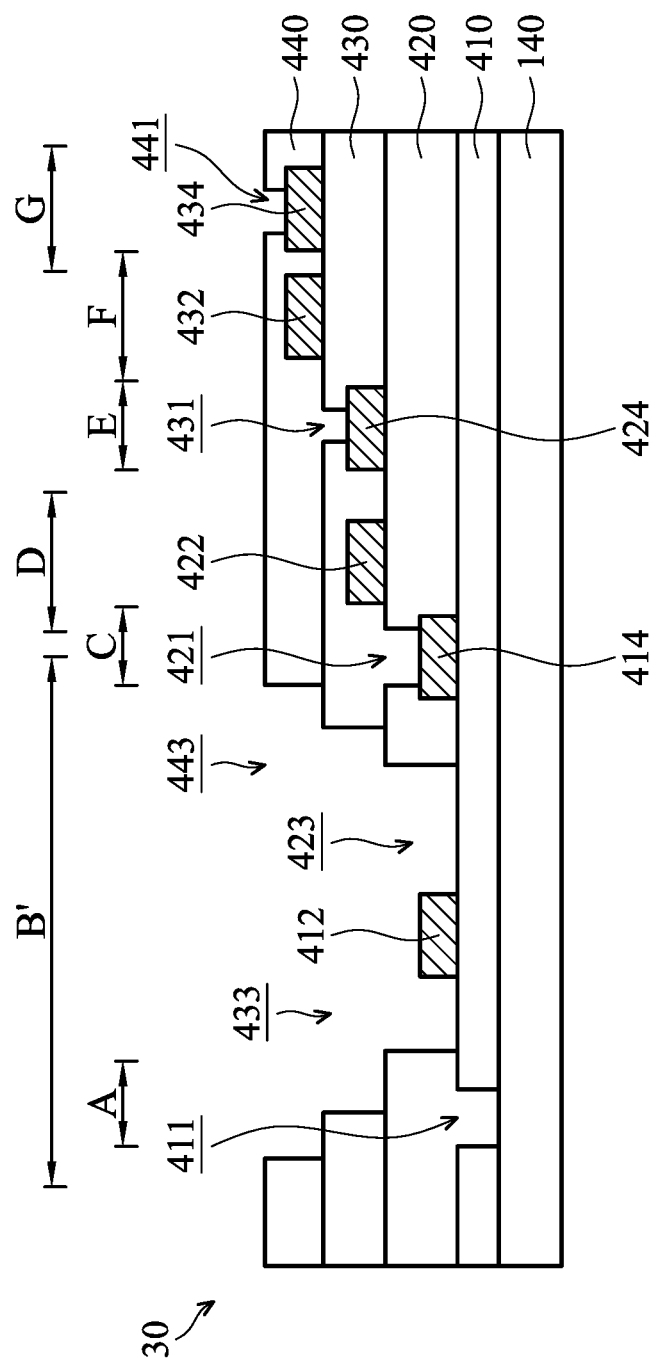

Afterwards, a third dielectric layer 430 is formed over the second dielectric layer 420, as shown in FIG. 4F, in accordance with some embodiments of the disclosure. It should be noted that the third dielectric layer 430 is in contact with the exposed top surface of the second alignment mark 414. The second alignment mark 414 is between the first dielectric layer 410 and the third dielectric layer 430. As mentioned above, the material of the second alignment mark 414 is different from that of the first dielectric layer 410, the third dielectric layer 430. Therefore, the stress is not concentrated on the second openings 421, and the problems of cracking are reduced.

Afterwards, a portion of the third dielectric layer 430 is removed, as shown in FIG. 4G, in accordance with some embodiments of the disclosure. As a result, the third dielectric layer 430 includes a second trench 433 and a third opening 431.

Figure 8:
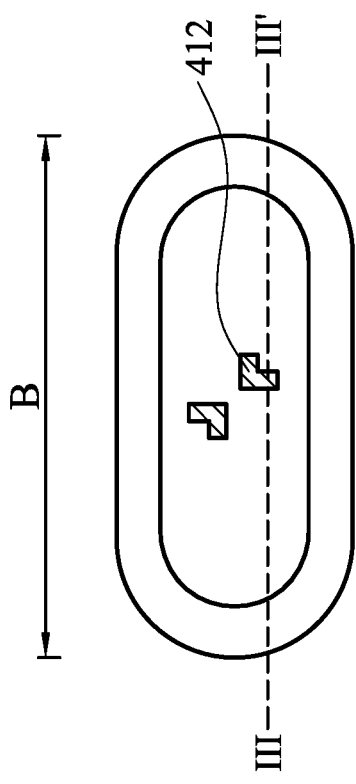
FIG. 8 shows a top-view representation of the first trench and the second trench, in accordance with some embodiments of the disclosure.

FIG. 8 shows a top-view representation of the first trench 423 and the second trench 433, in accordance with some embodiments of the disclosure. FIG. 4G is a cross-sectional representation along line of FIG. 8.

The second trench 433 is above the first trench 423. The width and area of the second trench 433 are greater than the width and area of the first trench 423. In the second region B, the sidewalls of the first trench 423 are not aligned to the sidewalls of the second trench 433. The sidewalls of the first trench 423 and the sidewalls of the second trench 433 form a step-shaped structure. In other words, the first alignment mark 412 is formed in the step-shaped trench. More specifically, a first sidewall of the first dielectric layer 410 and a second sidewall of the second dielectric layer 420 adjacent to the first alignment mark 412 forms a step-shaped structure, and the first alignment mark 412 is formed in the step-shaped trench.

If the first sidewalls of the first trench 423 are aligned to the second sidewalls of the second trench 433, the stress will be concentrated on the first sidewalls and the second sidewalls. The crack may generate along the first sidewalls and the second sidewalls. Since the first sidewalls of the first trench 423 are not aligned to the second sidewalls of the second trench 433, the stress is dispersed and not concentrated on the sidewalls. Therefore, the issue of cracking is resolved.

The first alignment mark 412 is exposed by the first trench 423 and the second trench 433, and it has a L-shaped top-view profile. The first alignment mark 412 may have another shape when seen from a top-view according to actual application.

Afterwards, a fifth alignment mark 432 and a sixth alignment mark 434 are formed over the third dielectric layer 430, as shown in FIG. 4H, in accordance with some embodiments of the disclosure. The fifth alignment mark 432 and a sixth alignment mark 434 are made of conductive material, such as metal or alloy.

Afterwards, a fourth dielectric layer 440 is formed over the fifth alignment mark 432 and the sixth alignment mark 434, as shown in FIG. 4I, in accordance with some embodiments of the disclosure. The fourth dielectric layer 440 has a third trench 443 to expose the first alignment mark 412 and a fourth opening 441 to expose the top surface of the sixth alignment mark 434.

Figure 9:
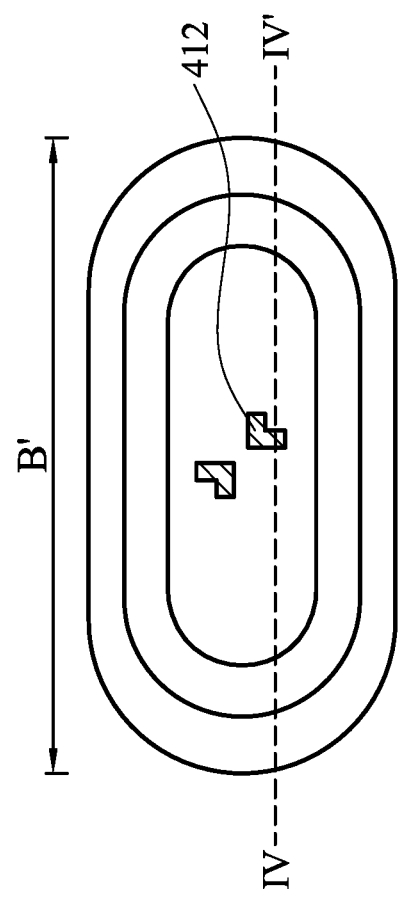
FIG. 9 shows a top-view representation of the first trench, the second trench and the third trench, in accordance with some embodiments of the disclosure.

FIG. 9 shows a top-view representation of the first trench 423, the second trench 433 and the third trench 443, in accordance with some embodiments of the disclosure. FIG. 4I is a cross-sectional representation along IV-IV' line of FIG. 9.

As shown in FIG. 9, in the second region B', the first trench 423, the second trench 433 and the third trench 443 form a step-shaped structure. The width of the step-shaped structure is gradually increased from bottom to top. The first trench 423, the second trench 433 and the third trench 443 independently have an ellipse-shaped or circle-shaped structure.

Figure 10:
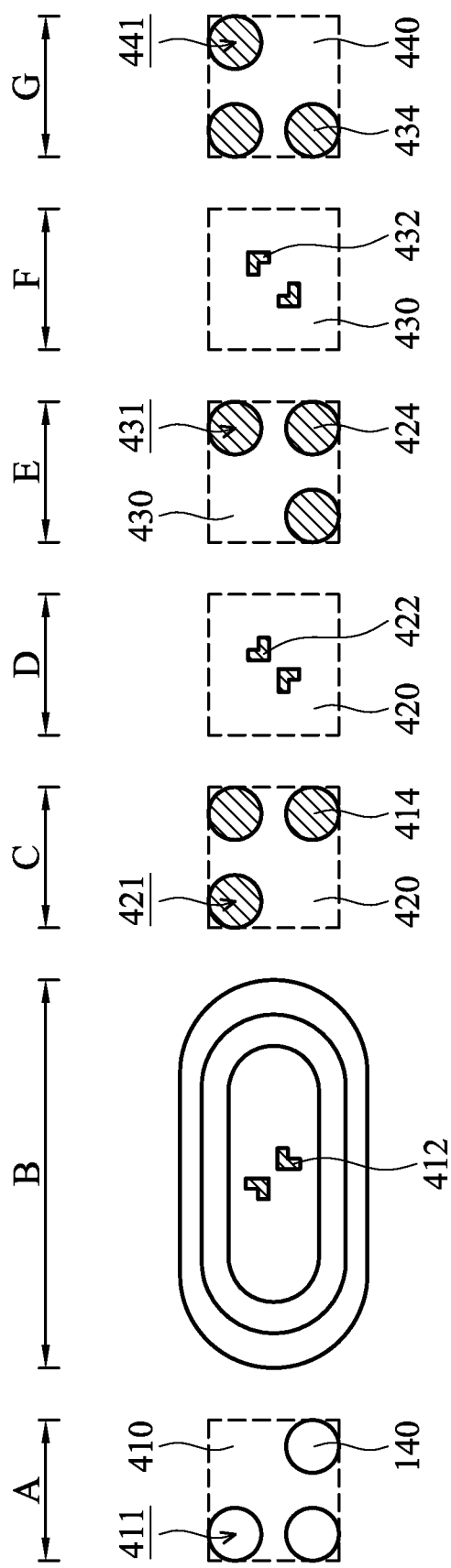
FIG. 10 shows a top-view representation of the alignment structure, in accordance with some embodiments of the disclosure.

FIG. 10 shows a top-view representation of the alignment structure 30 at different regions A-G, in accordance with some embodiments of the disclosure.

As shown in FIG. 10, in the first region A, the first dielectric layer 410 has at least three first openings 411. In the second region B', the first alignment mark 412 is exposed by the first trench 423, the second trench 433 and the third trench 443. A step-shaped structure is constructed by the first trench 423, the second trench 433 and the third trench 443. Each of the first trench 423, the second trench 433 and the third trench 443 has an ellipse-shaped or circle-shaped top-view profile. In the third region C, the second alignment mark 414 made of conductive material is exposed by the second opening 421.

In the fourth region D, the third alignment mark 422 is formed over the second dielectric layer 420. In the fifth region E, the fourth alignment mark 424 is formed in the third dielectric layer 430, and a portion of the fourth alignment mark 424 is exposed by the third opening 431. In the sixth region F, the fifth alignment mark 432 is formed over the third dielectric layer 430. In the seventh region G, the sixth alignment mark 441 is exposed by the fourth opening 441.

It should be noted that the pattern of the first openings 411 in the first region A, the pattern of the second openings 421 in the third region C, the pattern of the third opening 431 in the region E, and the pattern of the fourth opening 441 in the seventh region G are different to identify the location or the level of these alignment marks.

It should be noted that the first alignment mark 412 is exposed by the step-shaped structure to prevent cracking. In addition, the conductive materials are formed between two dielectric layers to reduce the cracking. For example, the second alignment mark 414 is between the first dielectric layer 410 and the second dielectric layer 420, and the fourth alignment mark 424 is between the second dielectric layer 420 and the third dielectric layer 430. Furthermore, the first openings 411, the second openings 421, the third openings 431 and the third openings 441 independently have rounded edges to reduce cracking.

Embodiments for forming a package structure and method for forming the same are provided. A semiconductor die is formed over a substrate, and a package layer covers the semiconductor die. An alignment structure is formed over the package layer. The alignment structure includes a first alignment mark formed in a step-shaped trench to reduce the stress. The alignment structure further includes a conductive second alignment mark between two dielectric layers to reduce the stress. The dielectric layer has an opening to expose the top surface of the second alignment mark. Therefore, the problems of cracking are reduced, and the performance of the package structure is further improved.

In some embodiments, a method for forming a package structure is provided. The method includes forming a package layer over a substrate, and forming a first dielectric layer over the package layer. The method further includes forming a first alignment mark and a second alignment mark over the first dielectric layer. The method includes forming a second dielectric layer over the first dielectric layer and removing a portion of the second dielectric layer to form a first trench to expose the first alignment mark, and to form a first opening to expose the second alignment.

In some embodiments, a method for forming a package structure is provided. The method includes forming a package layer over a substrate, and forming a first dielectric layer over the package layer. The method further includes forming a first alignment mark over the first dielectric layer, and forming a second dielectric layer over the first dielectric layer and the first alignment mark. The method further includes removing a portion of the second dielectric layer to expose the first alignment mark to form a first trench, and forming a third dielectric layer over the second dielectric layer and the first alignment. The method further includes removing a portion of the third dielectric layer to expose the first alignment mark to form a second trench, and the second trench is wider than the first trench.

In some embodiments, a method for forming a package structure is provided. The method includes forming a plurality of semiconductor dies over a substrate, and the substrate comprises a die region and a gap region. The method includes forming a package layer over the semiconductor dies, and forming a first dielectric layer over the package layer. The method further includes forming a first alignment mark over the first dielectric layer in the gap region, and forming a via structure over the package layer in the die region. The first alignment mark and the via structure are formed simultaneously. The method further includes forming a conductive layer over the via structure in the die region, and forming a second dielectric layer over the first dielectric layer and the first alignment mark. The method further includes forming a second alignment mark over the second dielectric layer in the gap region, and the second alignment mark and the conductive layer are formed simultaneously.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
    forming a package layer over a substrate;
    forming a first dielectric layer over the package layer;
    forming a first alignment mark and a second alignment mark over the first dielectric layer;
    forming a second dielectric layer over the first dielectric layer; and
    removing a portion of the second dielectric layer to form a first trench to expose a top surface of the first dielectric layer and the first alignment mark, and to form a first opening to expose the second alignment.

2. The method for forming the package structure as claimed in claim 1, further comprising:
    forming a second opening in the first dielectric layer to expose the package layer; and
    forming the second dielectric layer in the second opening.

3. The method for forming the package structure as claimed in claim 2, wherein the second opening has an ellipse-shaped or circle-shaped top-view profile.

4. The method for forming the package structure as claimed in claim 1, further comprising:
    forming a third dielectric layer over the second dielectric layer and in the first opening, wherein the second alignment mark is between the first dielectric layer and the third dielectric layer.

5. The method for forming the package structure as claimed in claim 4, further comprising:
    forming the third dielectric layer over the first alignment mark; and
    removing a portion of the third dielectric layer to expose the first alignment mark.

6. The method for forming the package structure as claimed in claim 1, further comprising:
    forming a plurality of semiconductor dies over the substrate, wherein the package layer is adjacent to the semiconductor dies.

7. The method for forming the package structure as claimed in claim 1, wherein a scribe line region is between two adjacent the semiconductor dies, wherein the first alignment mark is formed over the scribe line region.

8. The method for forming the package structure as claimed in claim 1, further comprising:
    forming a via structure over the package layer, wherein the via structure and the first alignment mark are formed simultaneously.

9. The method for forming the package structure as claimed in claim 1, further comprising:
    forming a third alignment mark and a fourth alignment mark over the second dielectric layer, wherein the third alignment mark is between the second alignment mark and the fourth alignment mark.

10. The method for forming the package structure as claimed in claim 9, further comprising:
    forming a first conductive layer over the package layer, wherein the first conductive layer and the third alignment mark are formed simultaneously.

11. A method for forming a package structure, comprising:
    forming a package layer over a substrate;
    forming a first dielectric layer over the package layer;
    forming a first alignment mark over the first dielectric layer;

forming a second dielectric layer over the first dielectric layer and the first alignment mark;

removing a portion of the second dielectric layer to expose the first alignment mark to form a first trench;

forming a third dielectric layer over the second dielectric layer and the first alignment; and removing a portion of the third dielectric layer to expose the first alignment mark to form a second trench, wherein the second trench is wider than the first trench.

12. The method for forming the package structure as claimed in claim 11, further comprising:

forming a second alignment mark while forming the first alignment mark.

13. The method for forming the package structure as claimed in claim 11, further comprising:

forming a third alignment mark and a fourth alignment mark over the second dielectric layer;

forming the third dielectric layer over the fourth alignment mark;

removing a portion of the third dielectric layer to expose a portion of the fourth alignment mark; and forming a fourth dielectric layer over the exposed portion of the fourth alignment mark.

14. The method for forming the package structure as claimed in claim 11, further comprising:

forming a plurality of semiconductor dies over the substrate, wherein the package layer is adjacent to the semiconductor dies; and forming a via structure over the package layer, wherein the via structure and the first alignment mark are formed simultaneously.

15. The method for forming the package structure as claimed in claim 14, wherein a scribe line region is between two adjacent the semiconductor dies, wherein the first alignment mark is formed over the scribe line region.

16. The method for forming the package structure as claimed in claim 11, wherein the first trench has a first sidewall, the second trench has a second sidewall, and the first sidewall of the first trench and the second sidewall of the second trench form a step-shaped structure.

17. A method forming a package structure, comprising:

forming a plurality of semiconductor dies over a substrate, wherein the substrate comprises a die region and a gap region;

forming a package layer over the semiconductor dies;

forming a first dielectric layer over the package layer;

forming a first alignment mark over the first dielectric layer in the gap region;

forming a via structure over the package layer in the die region, wherein the first alignment mark and the via structure are formed simultaneously;

forming a conductive layer over the via structure in the die region;

forming a second dielectric layer over the first dielectric layer and the first alignment mark; and forming a second alignment mark over the second dielectric layer in the gap region, wherein the second alignment mark and the conductive layer are formed simultaneously.

18. The method for forming the package structure as claimed in claim 17, further comprising:

removing a portion of the second dielectric layer to expose the first alignment mark to form a first trench.

19. The method for forming the package structure as claimed in claim 18, further comprising:

forming a third dielectric layer over the second dielectric layer and the first alignment and in the first trench; and removing a portion of the third dielectric layer to expose the first alignment mark to form a second trench, wherein the second trench is wider than the first trench.

20. The method for forming the package structure as claimed in claim 17, wherein a scribe line region is between two adjacent the semiconductor dies, wherein the first alignment mark is formed over the scribe line region.

* * * * *